(12) United States Patent
Fleissner et al.

(10) Patent No.: US 10,334,691 B2
(45) Date of Patent: Jun. 25, 2019

(54) ORGANIC LIGHT-EMITTING COMPONENT DEVICE, METHOD FOR PRODUCING AN ORGANIC LIGHT-EMITTING COMPONENT DEVICE AND METHOD FOR OPERATING AN ORGANIC LIGHT-EMITTING COMPONENT DEVICE

(71) Applicant: OSRAM OLED GmbH, Regensburg (DE)

(72) Inventors: Arne Fleissner, Regensburg (DE); Thomas Wehlus, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/773,196

(22) PCT Filed: Oct. 21, 2016

(86) PCT No.: PCT/EP2016/075368
§ 371 (c)(1),
(2) Date: May 3, 2018

(87) PCT Pub. No.: WO2017/080790
PCT Pub. Date: May 18, 2017

(65) Prior Publication Data
US 2018/0324926 A1 Nov. 8, 2018

(30) Foreign Application Priority Data
Nov. 10, 2015 (DE) .......... 10 2015 119 329

(51) Int. Cl.
H01L 27/32 (2006.01)
H01L 51/50 (2006.01)
(Continued)

(52) U.S. Cl.
CPC ..... *H05B 33/0896* (2013.01); *H01L 27/3209* (2013.01); *H01L 27/3225* (2013.01);
(Continued)

(58) Field of Classification Search
CPC . H05B 33/0896; H05B 37/0227; H01L 51/56; H01L 51/5253; H01L 27/3225;
(Continued)

(56) References Cited

U.S. PATENT DOCUMENTS

2003/0048243 A1 3/2003 Kwasnick
2005/0030267 A1* 2/2005 Tanghe ............... G09G 3/3216
345/82
(Continued)

FOREIGN PATENT DOCUMENTS

DE 102013107613 A1 1/2015
WO 2013030973 A1 3/2013
(Continued)

OTHER PUBLICATIONS

German Search Report based on application No. 10 2015 119 329.9 (7 pages) dated Jul. 8, 2016 (for reference purpose only).
(Continued)

*Primary Examiner* — Dedei K Hammond
*Assistant Examiner* — Raymond R Chai
(74) *Attorney, Agent, or Firm* — Viering, Jentschura & Partner MBB

(57) ABSTRACT

An organic light-emitting component device comprising a first and second organic light-emitting component, a temperature detecting device configured for detecting at least one temperature, and a control unit coupled to the temperature detecting device and configured to operate the first and second component. The control unit is such that a first or second operating parameter of the first or second component, respectively, is changed, wherein the temperature
(Continued)

detecting device comprises a first and second temperature detecting device. The first and second temperature detecting devices are designed for detecting a first and second temperature of the first and second component, respectively. The control unit is configured to change the first or second operating parameter depending on the difference between the first and second temperature, wherein the first or second operating parameter is changed such that the same temperature is established at the first and second component.

16 Claims, 6 Drawing Sheets

(51) Int. Cl.
  *H01L 51/52* (2006.01)
  *H01L 51/56* (2006.01)
  *H05B 33/08* (2006.01)
  *H05B 37/02* (2006.01)

(52) U.S. Cl.
  CPC .......... *H01L 51/50* (2013.01); *H01L 51/5253* (2013.01); *H01L 51/56* (2013.01); *H05B 33/0854* (2013.01); *H05B 37/0227* (2013.01); *H01L 2251/5361* (2013.01); *H01L 2251/556* (2013.01)

(58) Field of Classification Search
  CPC .......... H01L 27/3209; H01L 2251/5361; H01L 2251/556
  See application file for complete search history.

(56) References Cited

U.S. PATENT DOCUMENTS

| | | |
|---|---|---|
| 2011/0241572 A1 | 10/2011 | Zhang et al. |
| 2012/0086362 A1 | 4/2012 | Ota |
| 2014/0225507 A1* | 8/2014 | Hasegawa .......... H05B 33/0803 315/117 |
| 2015/0257239 A1* | 9/2015 | Robinson ............ H01L 33/0004 315/151 |
| 2016/0143112 A1* | 5/2016 | Jacobs ............... H05B 33/0896 315/155 |
| 2017/0032723 A1* | 2/2017 | Kim ....................... G09G 3/006 |

FOREIGN PATENT DOCUMENTS

| | | |
|---|---|---|
| WO | 2014097396 A1 | 6/2014 |
| WO | 2015011159 A1 | 1/2015 |

OTHER PUBLICATIONS

International Search Report based on application No. PCT/EP2016/075368 (6 pages + 3 pages English Translation) dated Feb. 2, 2017 (for reference purpose only).

\* cited by examiner

ORGANIC LIGHT-EMITTING COMPONENT DEVICE, METHOD FOR PRODUCING AN ORGANIC LIGHT-EMITTING COMPONENT DEVICE AND METHOD FOR OPERATING AN ORGANIC LIGHT-EMITTING COMPONENT DEVICE

CROSS-REFERENCE TO RELATED APPLICATION

The present application is a national stage entry according to 35 U.S.C. § 371 of PCT application No.: PCT/EP2016/075368 filed on Oct. 21, 2016, which claims priority from German Patent Application Serial No.: 10 2015 119 329.9 which was filed Nov. 10, 2015, and is incorporated herein by reference in its entirety.

TECHNICAL FIELD

The description relates generally to an organic light-emitting component device.

One or more embodiments may relate to a method for producing an organic light-emitting component device and a method for operating an organic light emitting component device.

SUMMARY

In various embodiments, an organic light-emitting component device, a method for producing an organic light-emitting component device and a method for operating an organic light-emitting component device are provided.

In newly designed automobile luminaires, for example a rear luminaire 600 illustrated schematically in FIG. 6, a plurality of organic light-emitting diodes 610 (OLED1-3) are intended to be installed. The organic light-emitting diodes 610 are operated with an operating current $j_{OLED}$, i.e. $j_{OLED1} = j_{OLED2} = j_{OLED3}$. In general and during operation, as a rule different temperatures are established for the different OLEDs 610; by way of example T(OLED2)>T(OLED3) and T(OLED3)>T(OLED1). Firstly that is owing to the inherent heating of the OLEDs 610 and the—depending on the installation situation within the luminaire 600—different dissipation of heat from the OLEDs 610. Secondly a temperature distribution can also occur per se within the automobile luminaire 600, with the result that each individual OLED 610 is exposed to different direct ambient temperatures. Moreover, in the case of OLEDs 610 of different sizes, the size of the OLEDs 610 can also have an influence on the different temperatures established at the OLEDs 610.

OLEDs age faster if they are operated at higher temperatures. By means of the different temperatures at the various OLEDs 610 within the luminaire 600, individual OLEDs age faster than others. The lifetime of the entire OLED luminaire 600 is therefore determined by the comparatively short lifetime of the individual OLED which is exposed to the highest temperature.

The effect of the faster aging at higher temperatures is nonlinear, such that different temperatures among various OLEDs result in non-uniform aging of the OLEDs particularly at higher temperatures overall.

OLEDs 610 used in automobile luminaires have hitherto been designed such that they still satisfy the lifetime specification in the specified mission profile even for the worst-case, i.e. hottest, installation situation. In this regard, the intention is to ensure that the OLED luminaire 600 in its entirety also satisfies the lifetime specification. By way of example, the entire luminaire 600 is operated below its rated power ("de-rating") in order to increase the lifetime of the luminaire 600.

In various embodiments, an organic light-emitting component device, a method for producing an organic light-emitting component device and a method for operating an organic light-emitting component device are provided which make it possible to prevent the comparatively fast aging of the individual OLEDs in the worst-case installation situation and thereby to increase the lifetime of an entire OLED luminaire.

In various exemplary embodiments, an organic light-emitting component device is provided. The organic light-emitting component device comprises: a first organic light-emitting component, and at least one second organic light-emitting component, a temperature detecting device configured for detecting at least one temperature, and a control unit coupled to the temperature detecting device and configured to operate the first organic light-emitting component and the at least one second organic light-emitting component. The control unit is formed in such a way that a first operating parameter of the first organic light-emitting component and/or a second operating parameter of the at least one second organic light-emitting component are/is changed depending on the at least one detected temperature in this way.

An operating parameter of an organic light-emitting component comprises or is for example the operating voltage, the current density of the operating current and/or the pulse, frequency and/or amplitude modulation in the case of pulsed driving. The changed first operating parameter can be identical to or different than the second operating parameter. By way of example, the changed first operating parameter can concern the current density and the changed second operating parameter can concern a change in the operating mode, for example from continuous operation to pulsed operation.

In other words: the first operating parameter and the second operating parameter can be changed identically or differently. Alternatively, the first operating parameter can remain unchanged and the second operating parameter can be changed, or vice-versa. In other words: the first operating parameter and the second operating parameter can in each case be increased, decreased or left unchanged.

In order to be able to operate the first organic light-emitting component and the at least one second organic light-emitting component, the control unit is electrically coupled to the first organic light-emitting component and the at least one second organic light-emitting component and configured to provide in each case an operating current to the organic light-emitting components.

In various exemplary embodiments, the first operating parameter and/or the second operating parameter are/is changed in such a way that the same or an approximately identical temperature is established at the first organic light-emitting component and the at least one second organic light-emitting component.

For the case where the first organic light-emitting component has a higher temperature than the second organic light-emitting component, for example the second operating parameter can be increased in such a way that the second organic light-emitting component heats up and matches the temperature of the first organic light-emitting component. Alternatively or additionally, the first operating parameter is decreased or reduced in such a way that the first organic light-emitting component cools down and matches the temperature of the second organic light-emitting component.

In summary, the organic light-emitting components, for example OLEDs, in different thermal installation situations, are operated at a constant, i.e. substantially identical or homogenous, temperature in critical situations by active control.

The current densities for the individual OLEDs, as an example, can be regulated, i.e. reduced or increased depending on the OLED, such that, on account of the different inherent heating for different luminances, all the OLEDs attain the same or approximately the same temperature. In this way, in the critical case of particularly high temperatures within the luminaire, for example under insolation in summer, non-uniform aging of the individual OLEDs is prevented.

Alternatively or additionally, the regulation of the driving of the OLEDs, that is to say the operation of the OLEDs at the same temperature by means of the adaptation of the current densities of the operating currents of the OLEDs, can find application not only when a temperature threshold value is exceeded, but rather generally. What is thereby achieved is that the OLEDs used in the OLED automobile luminaire age at the same or approximately the same rate. The lifetime of an OLED in the worst-case installation situation of an OLED assembly and/or of an OLED luminaire can be lengthened. The lifetime of the entire OLED luminaire can be lengthened to the same extent.

In various exemplary embodiments, the organic light-emitting component device is formed as an illuminant. In other words: the organic light-emitting component device can be formed as an exchangeable component which generates light from electrical energy.

In various exemplary embodiments, the organic light-emitting component device comprises a first light-emitting assembly configured for emitting a light of a first color valence and/or spectral distribution, and a second light-emitting assembly configured for emitting a light of a second color valence and/or spectral distribution. The first color valence and/or spectral distribution are/is different than the second color valence and/or spectral distribution. The first light-emitting assembly comprises the first organic light-emitting component and the at least one second organic light-emitting component.

In other words: the first organic light-emitting component and the second organic light-emitting component are part of a functionally interrelated and uniform or homogenous organic light-emitting assembly, for example of a brake light, of a travel direction indicator or the like.

In various exemplary embodiments, the temperature detecting device comprises a first temperature detecting device and at least one second temperature detecting device. The first temperature detecting device is designed for detecting a first temperature of the first organic light-emitting component, and the second temperature detecting device is designed for detecting a second temperature of the second organic light-emitting component. The control unit is configured to change the first operating parameter and/or the second operating parameter depending on the difference between the first temperature and the second temperature.

In other words: the adaptation of the first operating parameter and/or of the second report operating parameter is effected depending on the temperatures of the first organic light-emitting component and of the second organic light-emitting component. This enables a component-specific change of the operating parameters and thus a precise driving of the organic light-emitting components.

In various exemplary embodiments, the temperature detecting device comprises a temperature detecting device for detecting an ambient temperature and the at least one detected temperature is or comprises the ambient temperature. The ambient temperature can be the temperature of the surroundings of the component device and/or the temperature of the surroundings of the organic light-emitting components.

In various exemplary embodiments, the component device furthermore comprises a covering body, wherein the organic light-emitting components with the covering body shape or surround a cavity, and the ambient temperature comprises a temperature in the cavity. In other words: the detected temperature can be a temperature within a luminaire, for example the temperature of a cavity in the luminaire. The organic light-emitting components are arranged in the cavity in the luminaire. In other words: the organic light-emitting components together with the covering body shape, delimit, form or encompass the cavity. The covering body is for example transparent and comprises a glass or plastic or is formed therefrom.

In various exemplary embodiments, the control unit is configured to compare the detected ambient temperature with predefined temperature values and to change the first operating parameter and the second operating parameter in accordance with predefined operating parameters dependent on the predefined temperature values. By way of example, the installation situation and/or the thermal behavior of the organic light-emitting components can be determined and driving scenarios can thereupon be devised depending on the detected ambient temperature. This enables simple driving of the organic light-emitting components, for example with optional detection of the temperatures of the organic light-emitting components.

In various exemplary embodiments, the control unit comprises a stored first threshold value and is configured to compare the at least one detected temperature with the first threshold value, and a change of at least the first operating parameter and/or of the second operating parameter is effected only proceeding from a detected temperature greater than or equal to the first threshold value.

The first threshold value can be for example a temperature difference between the temperature of the first organic light-emitting component and the temperature of the second organic light-emitting component. In other words: the temperatures of the organic light-emitting components can be readjusted by means of the first threshold value for example only if the temperature difference between the organic light-emitting components is for example greater than approximately 5° C., greater than approximately 10° C., greater than approximately 20° C.

Alternatively or additionally, the first threshold value can be an absolute temperature value, for example in a range of approximately 30° C. to approximately 50° C., proceeding from which an active regulation is intended to commence, since for example the organic light-emitting components age faster proceeding from the first threshold value. In other words: proceeding from the first threshold value, the deviation between a linear temperature dependence of the aging and the nonlinear temperature dependence of the aging is too great or significant; by way of example, the deviation is greater than 5%, for example greater than 10%, for example greater than 20%.

In other words: if a specific, first threshold temperature is exceeded for example in an OLED automobile luminaire, the various OLEDs are no longer operated with identical current densities.

In various exemplary embodiments, the control unit comprises a stored second threshold value and is configured to compare the at least one detected temperature with the second threshold value, wherein a change of at least the first operating parameter and/or of the second operating parameter is exclusively effected if the detected temperature is less than or equal to the second threshold value.

By way of example, faster and more uniform heating of the organic light-emitting components to operating temperature can thereby be achieved at a low external temperature, for example of less than 0° C.

In various exemplary embodiments, the control unit comprises a stored third threshold value and is configured to compare the at least one detected temperature with the third threshold value, wherein the control unit, if the detected temperature reaches, exceeds or falls below the third threshold value, continues to operate the first organic light-emitting component and de-energizes at least the second organic light-emitting component.

As a result, by way of example, an emergency lighting is realized by virtue of a portion of the organic light-emitting components being switched off upon triggering of the third threshold value and at least the first organic light-emitting component being continued to be operated.

In various exemplary embodiments, at least the first organic light-emitting component comprises an organic light-emitting component and at least one further organic light-emitting component. In other words: the first organic light-emitting component can comprise an arrangement, for example a cluster, of organic light-emitting components for which for example an average temperature is detected as detected temperature. For two or more organic light-emitting components, for example if they have a similar installation situation, this makes it possible to use or to provide just one temperature detecting device, for example one temperature detector.

In various exemplary embodiments, at least the first organic light-emitting component is formed as a temperature detecting device, is formed such that it is operable at least partly as a temperature detecting device, or comprises a temperature detecting device.

By way of example, a temperature detector, for example a PTC or NTC thermistor, is monolithically integrated in the organic light-emitting component. As a result, the temperature can be detected directly in the organic light-emitting component. Alternatively, it is possible, for example at times, to use the organic light-emitting component as a temperature detector, for example by the conductivity or the electrical resistance of the organic light-emitting component being detected and compared with predefined and stored resistances or conductivities which correspond to different temperatures.

In various embodiments, a method for producing an organic light-emitting component device is provided. The method comprises: forming a first organic light-emitting component, and forming at least one second organic light-emitting component, forming a temperature detecting device configured for detecting at least one temperature, and forming a control unit coupled to the temperature detecting device and configured to operate the first organic light-emitting component and the at least one second organic light-emitting component. The control unit is formed in such a way that a first operating parameter of the first organic light-emitting component and/or a second operating parameter of the at least one second organic light-emitting component are/is changed depending on the at least one detected temperature in such a way that the same or an approximately identical temperature is established at the first organic light-emitting component and the at least one second organic light-emitting component.

In various exemplary embodiments, the first operating parameter and/or the second operating parameter are/is changed in such a way that the same or an approximately identical temperature is established at the first organic light-emitting component and the at least one second organic light-emitting component.

In various embodiments, a method for producing an organic light-emitting component device is provided. The organic light-emitting component device comprises: a first organic light-emitting component, and at least one second organic light-emitting component, a temperature detecting device configured for detecting at least one temperature, and a control unit coupled to the temperature detecting device and configured to operate the first organic light-emitting component and the at least one second organic light-emitting component. The control unit is formed in such a way that a first operating parameter of the first organic light-emitting component and/or a second operating parameter of the at least one second organic light-emitting component are/is changed depending on the at least one detected temperature in such a way that the same or an approximately identical temperature is established at the first organic light-emitting component and the at least one second organic light-emitting component. The method comprises: detecting at least one temperature, determining predefined at least first and second operating parameters, and driving the first organic light-emitting component with the first operating parameter, and driving the second organic light-emitting component with the second operating parameter.

In various exemplary embodiments, the first operating parameter and/or the second operating parameter are/is changed in such a way that the same or an approximately identical temperature is established at the first organic light-emitting component and the at least one second organic light-emitting component.

In various exemplary embodiments, the first operating parameter and/or the second operating parameter are/is changed in such a way that the intensity of the light which is emitted jointly by the first organic light-emitting component and the second organic light-emitting component after the change of the first operating parameter and/or of the second operating parameter is equal or substantially equal to the intensity of the light which is emitted jointly by the first organic light-emitting component and the second organic light-emitting component prior to the change.

In other words: the change of the current densities, that is to say the reduction or increase of the current density, of the various OLEDs of an OLED automobile luminaire can be regulated such that the luminous flux emitted overall by all the OLEDs remains unchanged, such that all standards with regard to brightness of the luminaire remain satisfied.

In various exemplary embodiments, the first operating parameter and/or the second operating parameter are/is changed in such a way that the intensity of the light which is emitted jointly by the first organic light-emitting component and the second organic light-emitting component after the change of the first operating parameter and/or of the second operating parameter is less than the intensity of the light which is emitted jointly by the first organic light-emitting component and the second organic light-emitting component prior to the change, but is greater than a predefined value.

The predefined value can be for example the value of a minimum intensity of a standard. This makes it possible to comply with the standard.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings in which.

DETAILED DESCRIPTION

Figure 1:
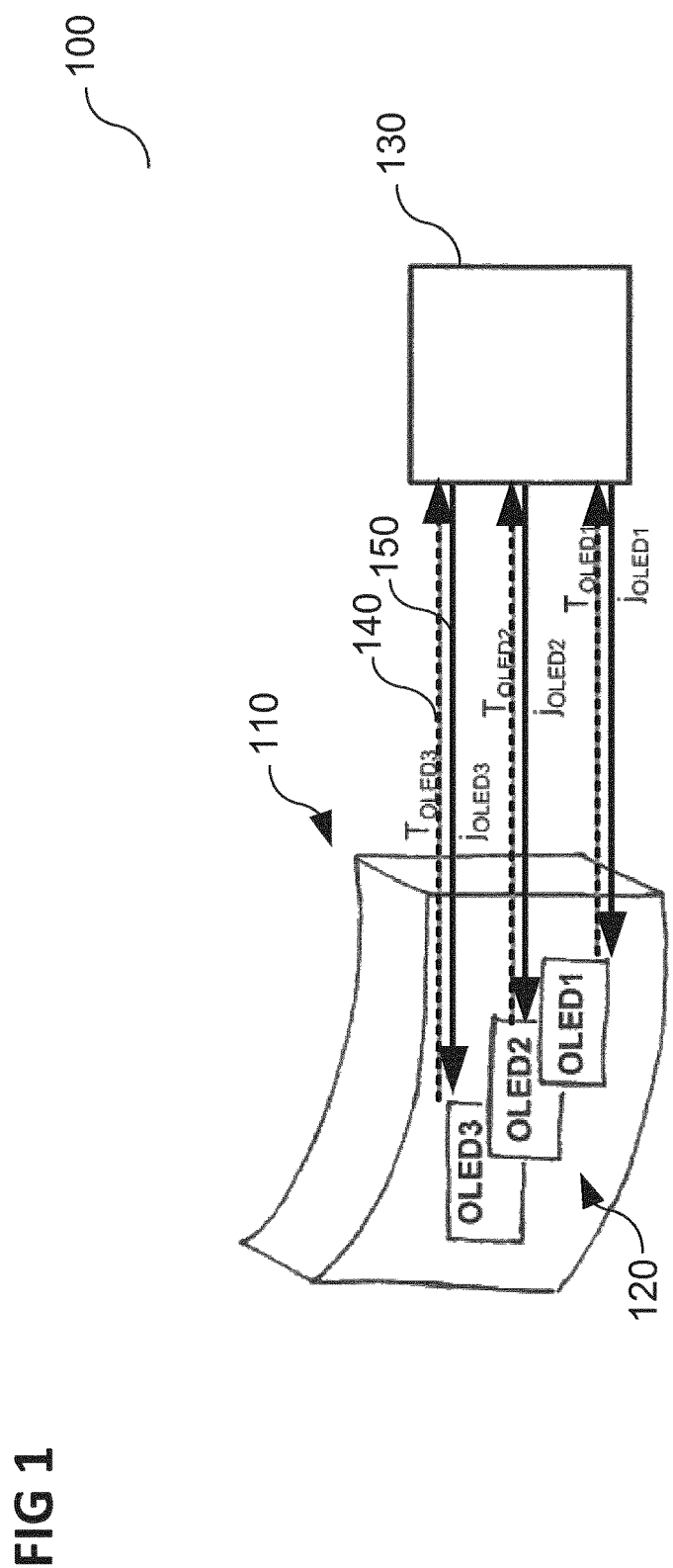
FIG. 1 shows a schematic illustration of an organic light-emitting component device in accordance with various exemplary embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

One or more embodiments may be practiced without one or more of the specific details, or with other methods, components, materials, etc. In other instances, well-known structures, materials, or operations are not shown or described in detail to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The word "exemplary" is used herein to mean "serving as an example, instance or illustration". Any embodiment or design described herein as "exemplary" is not necessarily to be construed as preferred or advantageous over other embodiments or designs.

In the context of this description, the terms "connected" and "coupled" are used to describe both a direct and an indirect connection and a direct or indirect coupling. In the figures, identical or similar elements are provided with identical reference signs, insofar as this is expedient.

In the context of this description, an organic light-emitting component is a component which generates light from electrical energy. An organic light-emitting component, for example an organic light-emitting diode (OLED), comprises a first electrode, for example as anode, and a second electrode, for example as cathode, with an organic functional layer system therebetween. The organic functional layer system can comprise one or a plurality of emitter layer(s) in which electromagnetic radiation is generated, one or a plurality of charge generating layer structures each comprising two or more charge generating layers (CGLs) for charge generation, and one or a plurality of electron blocking layers, also referred to as hole transport layer(s) (HTL), and one or a plurality of hole blocking layers, also referred to as electron transport layer(s) (ETL), in order to direct the current flow. The luminance and light color of an organic component is limited inter alia by the maximum current density which can flow through the diode, and by the electroluminescent material of the emitter layer(s). In order to increase the luminance of an OLED, one or a plurality of OLEDs are stacked one on top of another.

In various exemplary embodiments, an organic light-emitting component is formed in a planar fashion. A planar, organic light-emitting component comprising two planar optically active sides can be formed for example as transparent or translucent in the connecting direction of the optically active sides, for example as a transparent or translucent organic light-emitting diode. A planar organic component can also be referred to as a plane organic component.

However, the optically active region can also comprise a planar optically active side and a planar optically inactive side, for example an organic light-emitting diode configured as a so-called top emitter or bottom emitter. In various exemplary embodiments, the optically inactive side can be transparent or translucent, or be provided with a mirror structure and/or an opaque substance or substance mixture, for example for heat distribution. The beam path of the organic component can be directed on one side, for example.

The first electrode, the second electrode and the organic functional layer structure of an organic component can each be formed with a large area. As a result, the organic component can have a continuous luminous area which is not structured into functional partial regions, for example a luminous area segmented into functional regions, or around a luminous area formed by a multiplicity of pixels. A large-area emission of electromagnetic radiation from the organic component can be made possible as a result. In this case, "large area" can mean that the optically active side has an area, for example a continuous area, for example of greater than or equal to a few square millimeters, for example greater than or equal to one square centimeter, for example greater than or equal to one square decimeter. By way of example, the organic component can have just a single continuous luminous area brought about by the large-area and continuous formation of the electrodes and the organic functional layer structure.

In the context of this description, the organic light-emitting component in various exemplary embodiments can be formed such that it is elastic in a planar fashion, that is to say can be curved reversibly and forms a restoring force directed counter to the direction of the curving force.

In various exemplary embodiments, the term "translucent" or "translucent layer" can be understood to mean that a layer is transmissive to light, for example to the light generated by the light-emitting component, for example in one or more wavelength ranges, for example to light in a wavelength range of visible light (for example at least in a partial range of the wavelength range of 380 nm to 780 nm). By way of example, the term "translucent layer" in various exemplary embodiments should be understood to mean that substantially the entire quantity of light coupled into a structure (for example a layer) is also coupled out from the structure (for example layer), wherein part of the light can be scattered here.

In various exemplary embodiments, the term "transparent" or "transparent layer" can be understood to mean that a layer is transmissive to light (for example at least in a partial range of the wavelength range of 380 nm to 780 nm), wherein light coupled into a structure (for example a layer) is also coupled out from the structure (for example layer) substantially without scattering or light conversion. Consequently, "transparent" in various exemplary embodiments should be regarded as a special case of "translucent".

In the context of this description, a different design of two organic light-emitting components can be manifested if two organic light-emitting components differ in at least one optoelectronic or optical property and/or have a different layer cross section. The organic light-emitting components are thus identical or approximately identical if such a difference is not present.

FIG. 1 shows a schematic illustration of an organic light-emitting component device 100 in accordance with various exemplary embodiments. In various exemplary embodiments, the organic light-emitting component device 100 comprises an organic light-emitting luminaire 110 and a control unit 130. The control unit 130 is coupled to the organic light-emitting luminaire 110.

The control unit 130 is for example formed as or comprises a processor, for example a microprocessor. The control unit 130 can also be referred to as an electronic control unit, driver or driver structure.

The organic light-emitting luminaire 110 comprises organic light-emitting components 120, i.e. a first organic light-emitting component OLED1 and at least one second organic light-emitting component OLED2.

In the exemplary embodiment of a luminaire 110 as illustrated in FIG. 1, three organic light-emitting components OLED1, OLED2, OLED3 are shown. However, the organic light-emitting luminaire 110 can also comprise more organic light-emitting components.

The at least second organic light-emitting component OLED2, OLED3 is arranged for example alongside and/or above the first organic light-emitting component OLED1. The at least second organic light-emitting component OLED2, OLED3 can have a design that is the same or approximately the same as that of the first organic light-emitting component OLED1. The at least second organic light-emitting component OLED2, OLED3 can be arranged at a different position, with different thermal properties, for example a different heat dissipation or heat capacity, in the organic light-emitting component device in comparison with the first organic light-emitting component OLED1. As a result, the at least one second organic light-emitting component OLED2, OLED3 can have different thermal behavior during operation in comparison with the first organic component, for example a different temperature or heating.

In various exemplary embodiments, the organic light-emitting components OLED1, OLED2, OLED3 are at least part of an assembly of an organic light-emitting luminaire 110. In the case of a tail or rear luminaire of a vehicle, an assembly is for example the rear light, the brake luminaire, the travel direction indicator, the reversing light or the rear fog lamp. In other words: in various exemplary embodiments, the organic light-emitting components OLED1, OLED2, OLED3 have the same or an approximately identical design and can emit approximately identical light, i.e. light having the same or approximately the same color valence or the same or approximately the same spectral distribution.

In various exemplary embodiments, each of the organic light-emitting components OLED1, OLED2, OLED3 of the organic light-emitting luminaire 110 comprises a temperature detecting device, is operated as a temperature detecting device at times, or is thermally coupled to a temperature detecting device, such that the temperature detecting device can detect a present temperature of the organic light-emitting component. In other words: the temperature detecting device is designed to detect the temperature $T_{OLED1}$, $T_{OLED2}$, $T_{OLED3}$ of the respective organic light-emitting component OLED1, OLED2, OLED3.

In various exemplary embodiments, an organic light-emitting component OLED1, OLED2, OLED3 comprises an organic light-emitting component and at least one further organic light-emitting component. In other words: the temperature detecting device is designed to determine an averaged temperature in the case of an organic light-emitting component comprising a plurality of organic light-emitting components, for example a cluster of organic light-emitting components, for example for the case where the plurality of organic light-emitting components of the organic light-emitting component OLED1, OLED2, OLED3 exhibit and/or have identical or approximately identical thermal behavior.

Figure 3:
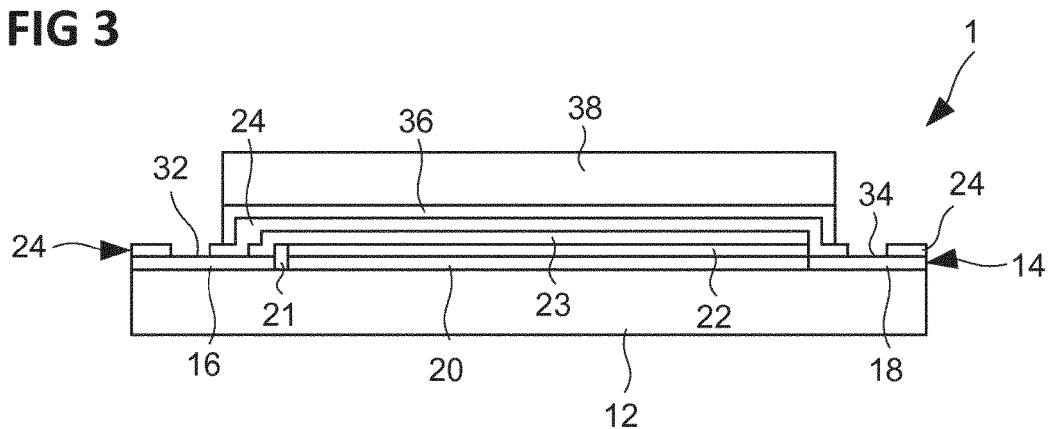
FIG. 3 shows a schematic illustration of an organic light-emitting component in accordance with various exemplary embodiments.

The temperature detecting device is formed for example as a temperature detector, for example a PTC or NTC thermistor, which is arranged electrically in parallel with an optically active structure (see also FIG. 3).

The organic light-emitting component device 100 is formed in such a way that the control unit 130 can read out the temperatures $T_{OLED1}$, $T_{OLED2}$, $T_{OLED3}$ of the organic light-emitting components OLED1, OLED2, OLED3 (illustrated in FIG. 1 by means of the arrows 140 with a dashed line). In other words: in various exemplary embodiments, the organic light-emitting luminaire 110 is designed to detect a first temperature $T_{OLED1}$ and at least one second temperature $T_{OLED2}$, $T_{OLED3}$ and to communicate them to the control unit 130. The temperatures $T_{OLED1}$, $T_{OLED2}$, $T_{OLED3}$ are detected in the vicinity of, on or in the respective organic light-emitting component OLED1, OLED2, OLED3.

In the exemplary embodiment illustrated in FIG. 1, the control unit 130 is configured to energize, i.e. to operate, the organic light-emitting components OLED1, OLED2, OLED3 with a respective electric current $j_{OLED1}$, $j_{OLED2}$, $j_{OLED3}$ (illustrated in FIG. 1 by means of the arrows 150 with a solid line).

The control unit 130 sets the electric current having the electric current density $j_{OLED1}$, $j_{OLED2}$, $j_{OLED3}$ depending on the detected temperature $T_{OLED1}$, $T_{OLED2}$, $T_{OLED3}$ such that the temperatures of the organic light-emitting components OLED1, OLED2, OLED3 approximate to or match one another. In other words: the organic light-emitting components OLED1, OLED2, OLED3 are driven or actively regulated in such a way that the difference between the temperatures $T_{OLED1}$, $T_{OLED2}$, $T_{OLED3}$ is reduced, for example to less than 10%, for example to less than 5%, for example to the magnitude of the measurement error of the temperature detecting device. In other words: the temperatures $T_{OLED1}$, $T_{OLED2}$, $T_{OLED3}$ of the organic light-emitting components OLED1, OLED2, OLED3 are equal or approximately equal. In other words: in various exemplary embodiments, the control unit 130 is formed in such a way that the current density $j_{OLED1}$, $j_{OLED2}$, $j_{OLED3}$ of the electric current for operating the organic light-emitting components OLED1, OLED2, OLED3 is adapted individually and functionally dependently on the temperature $T_{OLED1}$, $T_{OLED2}$, $T_{OLED3}$ of the respective organic light-emitting component OLED1, OLED2, OLED3, i.e. is actively regulated component-specifically.

In various exemplary embodiments, the current density $j_{OLED}$ of a first organic light-emitting component OLED1, OLED2, OLED3 is reduced in order to reduce the temperature of the first organic light-emitting component OLED1, OLED2, OLED3. Alternatively or additionally, the current density $j_{OLED}$ of a second organic light-emitting component OLED1, OLED2, OLED3 is increased in order to increase the temperature of the second organic light-emitting component OLED1, OLED2, OLED3.

In various exemplary embodiments, a threshold value up to which the current density $j_{OLED}$ of an organic light-emitting component OLED1, OLED2, OLED3 is or can be increased is provided for the driving of the organic light-emitting components OLED1, OLED2, OLED3.

In various exemplary embodiments, a further threshold value is provided for the driving of the organic light-emitting components OLED1, OLED2, OLED3, proceeding from which further threshold value the current density $j_{OLED}$ of the organic light-emitting components OLED1, OLED2, OLED3 is changed in order that the temperatures $T_{OLED1}$, $T_{OLED2}$, $T_{OLED3}$ of the organic light-emitting components OLED1, OLED2, OLED3 match one another.

In various exemplary embodiments, the current densities $j_{OLED1}$, $j_{OLED2}$, $j_{OLED3}$ of the organic light-emitting components OLED1, OLED2, OLED3 are regulated in such a way that the luminous flux emitted overall by all the organic light-emitting components OLED1, OLED2, OLED3 remains unchanged in such a way that all standards with regard to the brightness of the organic light-emitting component device 100 and/or of the organic light-emitting luminaire 110 remain satisfied.

In other words: in various exemplary embodiments, an organic light-emitting component device 100 is provided. The organic light-emitting component device 100 comprises a first organic light-emitting component OLED1, and at least one second organic light-emitting component OLED2, OLED3.

Figure 2:
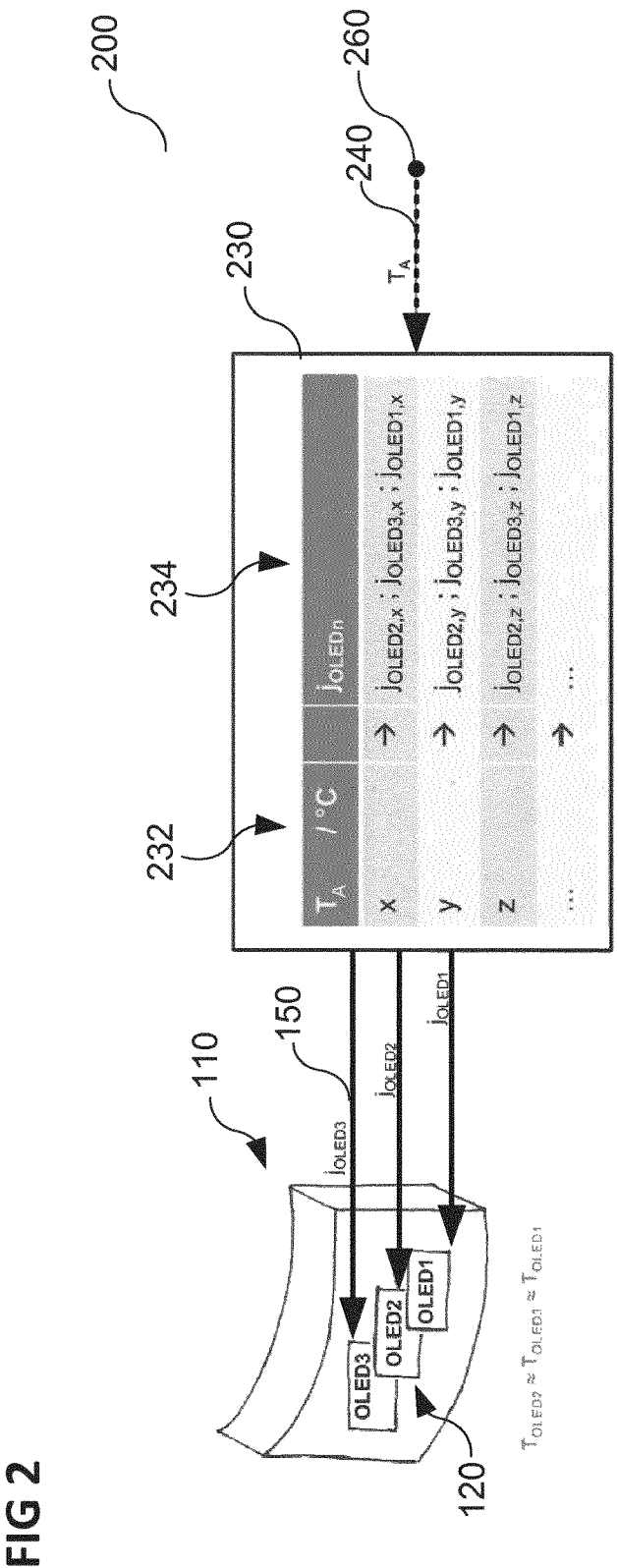
FIG. 2 shows a schematic illustration of an organic light-emitting component device in accordance with various exemplary embodiments.

The organic light-emitting component device 100 furthermore comprises a temperature detecting device configured for detecting at least one temperature $T_{OLED1-3}$, $T_A$ (see FIG. 2).

The organic light-emitting component device 100 comprises a control unit 130 coupled to the temperature detecting device. The control unit 130 is configured to operate the first organic light-emitting component OLED1 and the at least one second organic light-emitting component OLED2, OLED3.

The control unit 130 is formed in such a way that a first operating parameter $j_{OLED1}$ of the first organic light-emitting component OLED1 and/or a second operating parameter $j_{OLED2}$, $j_{OLED3}$ of the at least one second organic light-emitting component OLED2, OLED3 are/is changed depending on the at least one detected temperature $T_{OLED1}$, $T_{OLED2}$, $T_{OLED3}$, $T_A$ in such a way that the same or an approximately identical temperature is established at the first organic light-emitting component OLED1 and the at least one second organic light-emitting component OLED2, OLED3, i.e. $T_{OLED1}$ is equal or approximately equal to $T_{OLED2}$, $T_{OLED3}$.

An operating parameter of an organic light-emitting component comprises or is for example the operating voltage, the current density of the operating current and/or the pulse, frequency and/or amplitude modulation in the case of pulsed driving. The changed first operating parameter can be identical to or different than the second operating parameter. By way of example, the changed first operating parameter can concern the current density and the changed second operating parameter can concern a change in the operating mode, for example from continuous operation to pulsed operation.

In various developments, the organic light-emitting component device 100 is formed as an illuminant.

In various developments, the organic light-emitting component device 100 furthermore comprises a first light-emitting assembly configured for emitting a light of a first color valence, and a second light-emitting assembly configured for emitting a light of a second color valence, wherein the first color valence is different than the second color valence. In this case, the first light-emitting assembly comprises the first organic light-emitting component OLED1 and the at least one second organic light-emitting component OLED2, OLED3.

In various developments, the temperature detecting device comprises a first temperature detecting device and at least one second temperature detecting device. The first temperature detecting device is designed for detecting a first temperature $T_{OLED1}$ of the first organic light-emitting component OLED1 and the second temperature detecting device is designed for detecting a second temperature $T_{OLED2}$, $T_{OLED3}$ of the second organic light-emitting component OLED2, OLED3. The control unit 130 is configured to change the first operating parameter $j_{OLED1}$ and/or the second operating parameter $j_{OLED2}$, $j_{OLED3}$ depending on the difference between the first temperature $T_{OLED1}$ and the second temperature $T_{OLED2}$, $T_{OLED3}$.

In various developments, the control unit 130 comprises a stored first threshold value. The control unit 130 is configured to compare the at least one detected temperature with the first threshold value, wherein a change of at least the first operating parameter $j_{OLED1}$ and/or of the second operating parameter $j_{OLED2}$, $j_{OLED3}$ is effected only proceeding from a detected temperature greater than or equal to the first threshold value.

In various developments, the control unit 130 comprises a stored second threshold value. The control unit 130 is configured to compare the at least one detected temperature with the second threshold value. A change of at least the first operating parameter $j_{OLED1}$ and/or of the second operating parameter $j_{OLED2}$, $j_{OLED3}$ is exclusively effected if the detected temperature is less than or equal to the second threshold value.

In various developments, the control unit 130 comprises a stored third threshold value. The control unit 130 is configured to compare the at least one detected temperature with the third threshold value, wherein the control unit 130, 230, if the detected temperature reaches, exceeds or falls below the third threshold value, continues to operate the first organic light-emitting component OLED1 and de-energizes at least the second organic light-emitting component OLED2, OLED3.

In various developments, at least the first organic light-emitting component OLED1 comprises an organic light-emitting component and at least one further organic light-emitting component.

In various developments, at least the first organic light-emitting component OLED1 is formed as a temperature detecting device, is formed such that it is operable at least partly as a temperature detecting device, or comprises a temperature detecting device.

In various developments, each organic light-emitting component 120 comprises a temperature detecting device.

FIG. 2 shows a schematic illustration of an organic light-emitting component device 200 in accordance with various exemplary embodiments, which can substantially correspond to one of the exemplary embodiments illustrated above. In addition or as an alternative to the temperature detecting devices coupled to the organic light-emitting components OLED1, OLED2, OLED3, the organic light-emitting component device 200 can comprise an external temperature detecting device 260, which is coupled to the control unit 230 and detects an ambient temperature $T_A$ (illustrated in FIG. 2 by means of the arrow 240 with a dashed line). The ambient temperature $T_A$ is for example an external temperature relative to the component device, an external temperature relative to the luminaire and/or a temperature in the luminaire, for example for the case where the luminaire has a cavity enclosed by a covering body, as for example in the case of a headlight.

In various exemplary embodiments, the control unit 230 is formed in such a way that in a register for a predefined ambient temperature 232 (different temperatures are designated by x, y, z . . . ) there is stored in each case a predefined current density 234 (different current densities for a temperature i=x, y, z, are designated by $j_{OLED1,i}$, $j_{OLED2,i}$, $j_{OLED3,i}$) for the operating currents of the organic light-emitting components OLED1, OLED2, OLED3. In other words: the control unit 230 can energize the organic light-emitting components OLED1, OLED2, OLED3 in each case with electric currents having a predefined current density $j_{OLED1,i}$, $j_{OLED2,i}$, $j_{OLED3,i}$ depending on an ambient temperature $T_A$. As a result, by way of example, at low ambient temperatures, for example less than 0° C., rapid attainment of the operating temperature of the organic light-emitting components OLED1, OLED2, OLED3 can be achieved or, at elevated ambient temperatures, for example greater than 50° C., it is possible to reduce or stop the increase of the operating current of the organic light-emitting components OLED1, OLED2, OLED3 in order to reduce the temperature difference. By way of example, the threshold value described above can be adapted depending on the ambient temperature, i.e. be reduced for example at elevated ambient temperatures.

In other words: the typical temperature distribution within the luminaire 110 as a function of, for example, the external or ambient temperature $T_A$ and the temperatures then typically present at the different organic light-emitting components OLED1, OLED2, OLED3 are calculated, simulated and/or measured once. Different driving scenarios 234 are derived therefrom for the control unit 230, which scenarios are fixedly programmed or stored in the control unit 230 and can be applied for example depending on the ambient temperature x, y, z.

In various exemplary embodiments, the organic light-emitting component device comprises a temperature detecting device for detecting the ambient temperature TA and the temperatures of the organic light-emitting components.

In various exemplary embodiments, yet another threshold value can be provided, which is dependent on the detected ambient temperature $T_A$, the highest detected temperature of the temperatures $T_{OLED1}$, $T_{OLED2}$, $T_{OLED3}$ of the organic light-emitting components OLED1, OLED2, OLED3 and/or the averaged temperature of the temperatures $T_{OLED1}$, $T_{OLED2}$, $T_{OLED3}$ of the organic light-emitting components OLED1, OLED2, OLED3. Upon the third threshold value being exceeded, by way of example, the luminaire 110, 210 can be switched off apart from emergency lighting, for example the first organic light-emitting component.

In other words: in various developments, the temperature detecting device comprises a temperature detecting device 260 for detecting an ambient temperature $T_A$. The at least one detected temperature is or comprises the ambient temperature $T_A$.

In various developments, the control unit 230 is configured to compare the detected ambient temperature $T_A$ with predefined temperature values 232 and to change the first operating parameter $j_{OLED1}$ and the second operating parameter $j_{OLED2}$, $j_{OLED3}$ in accordance with predefined operating parameters 234 dependent on the predefined temperature values 232.

FIG. 3 shows one exemplary embodiment of an organic light-emitting component 1, which can substantially correspond to one of the exemplary embodiments OLED1, OLED2, OLED3 illustrated above, and vice-versa.

The organic light-emitting component 1 comprises a carrier 12. The carrier 12 can be formed as translucent or transparent. The carrier 12 serves as a carrier element for electronic elements or layers, for example light-emitting elements. The carrier 12 can comprise or be formed from, for example, plastic, metal, glass, quartz and/or a semiconductor material. Furthermore, the carrier 12 can comprise or be formed from one plastics film or a laminate comprising one or comprising a plurality of plastics films. The carrier 12 can be formed as mechanically rigid or mechanically flexible.

An optoelectronic layer structure is formed on the carrier 12. The optoelectronic layer structure comprises a first electrode layer 14, which comprises a first contact section 16, a second contact section 18 and a first electrode 20. The carrier 12 with the first electrode layer 14 can also be referred to as a substrate. A first barrier layer (not illustrated), for example a first barrier thin-film layer, can be formed between the carrier 12 and the first electrode layer 14.

The first electrode 20 is electrically insulated from the first contact section 16 by means of an electrical insulation barrier 21. The second contact section 18 is electrically coupled to the first electrode 20 of the optoelectronic layer structure. The first electrode 20 can be formed as an anode or as a cathode. The first electrode 20 can be formed as translucent or as transparent. The first electrode 20 comprises an electrically conductive material, for example metal and/or a transparent conductive oxide (TCO) or a layer stack comprising a plurality of layers comprising metals or TCOs. The first electrode 20 can comprise for example a layer stack of a combination of a layer of a metal on a layer of a TCO, or vice-versa. One example is a silver layer applied on an indium tin oxide (ITO) layer (Ag on ITO) or ITO-Ag-ITO multilayers. The first electrode 20 can comprise as an alternative or in addition to the materials mentioned: networks composed of metallic nanowires and nanoparticles, for example composed of Ag, networks composed of carbon nanotubes, graphene particles and graphene layers and/or networks composed of semiconducting nanowires.

An optically functional layer structure, for example an organic functional layer structure 22, of the optoelectronic layer structure is formed above the first electrode 20. The organic functional layer structure 22 can comprise for example one, two or more partial layers. By way of example, the organic functional layer structure 22 can comprise a hole injection layer, a hole transport layer, an emitter layer, an electron transport layer and/or an electron injection layer. The hole injection layer serves for reducing the band gap between first electrode and hole transport layer. In the case of the hole transport layer, the hole conductivity is greater than the electron conductivity. The hole transport layer serves for transporting the holes. In the case of the electron transport layer, the electron conductivity is greater than the hole conductivity. The electron transport layer serves for transporting the electrons. The electron injection layer serves for reducing the band gap between second electrode and electron transport layer. Furthermore, the organic functional layer structure 22 can comprise one, two or more functional layer structure units each comprising the partial layers mentioned and/or further intermediate layers.

A second electrode 23 of the optoelectronic layer structure is formed above the organic functional layer structure 22, said second electrode being electrically coupled to the first contact section 16. The second electrode 23 can be formed in accordance with one of the configurations of the first electrode 20, wherein the first electrode 20 and the second electrode 23 can be formed identically or differently. The first electrode 20 serves for example as an anode or a cathode of the optoelectronic layer structure. The second electrode 23, in a manner corresponding to the first electrode, serves as a cathode or respectively an anode of the optoelectronic layer structure.

The optoelectronic layer structure is an electrically and/or optically active region. The active region is for example the region of the organic light-emitting component 1 in which electric current for the operation of the organic light-emitting component 1 flows and/or in which electromagnetic radiation is generated or absorbed. A getter structure (not illustrated) can be arranged on or above the active region. The getter layer can be formed as translucent, transparent or opaque. The getter layer can comprise or be formed from a material that absorbs and binds substances that are harmful to the active region.

An encapsulation layer 24 of the optoelectronic layer structure is formed above the second electrode 23 and partly above the first contact section 16 and partly above the second contact section 18, said encapsulation layer encapsulating the optoelectronic layer structure. The encapsulation layer 24 can be formed as a second barrier layer, for example as a second barrier thin-film layer. The encapsulation layer 24 can also be referred to as thin film encapsulation. The encapsulation layer 24 forms a barrier vis à vis chemical contaminants or atmospheric substances, in particular vis à vis water (moisture) and oxygen. The encapsulation layer 24 can be formed as a single layer, a layer stack or a layer structure. The encapsulation layer 24 can comprise or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), Nylon 66, and mixtures and alloys thereof. If appropriate, the first barrier layer on the carrier 12 can be formed in a manner corresponding to a configuration of the encapsulation layer 24.

In the encapsulation layer 24, a first cutout of the encapsulation layer 24 is formed above the first contact section 16 and a second cutout of the encapsulation layer 24 is formed above the second contact section 18. A first contact region 32 is exposed in the first cutout of the encapsulation layer 24 and a second contact region 34 is exposed in the second cutout of the encapsulation layer 24. The first contact region 32 serves for electrically contacting the first contact section 16 and the second contact region 34 serves for electrically contacting the second contact section 18.

An adhesion-medium layer 36 is formed above the encapsulation layer 24. The adhesion-medium layer 36 comprises for example an adhesion medium, for example an adhesive, for example a lamination adhesive, a lacquer and/or a resin. The adhesion-medium layer 36 can comprise for example particles which scatter electromagnetic radiation, for example light-scattering particles.

A covering body 38 is formed above the adhesion-medium layer 36. The adhesion-medium layer 36 serves for securing the covering body 38 to the encapsulation layer 24. The covering body 38 comprises for example plastic, glass and/or metal. By way of example, the covering body 38 can substantially be formed from glass and comprise a thin metal layer, for example a metal film, and/or a graphite layer, for example a graphite laminate, on the glass body. The covering body 38 serves for protecting the conventional organic light-emitting component 1, for example against mechanical force influences from outside. Furthermore, the covering body 38 can serve for distributing and/or dissipating heat that is generated in the conventional organic light-emitting component 1. By way of example, the glass of the covering body 38 can serve as protection against external influences and the metal layer of the covering body 38 can serve for distributing and/or dissipating the heat arising during the operation of the conventional organic light-emitting component 1.

Figure 4:
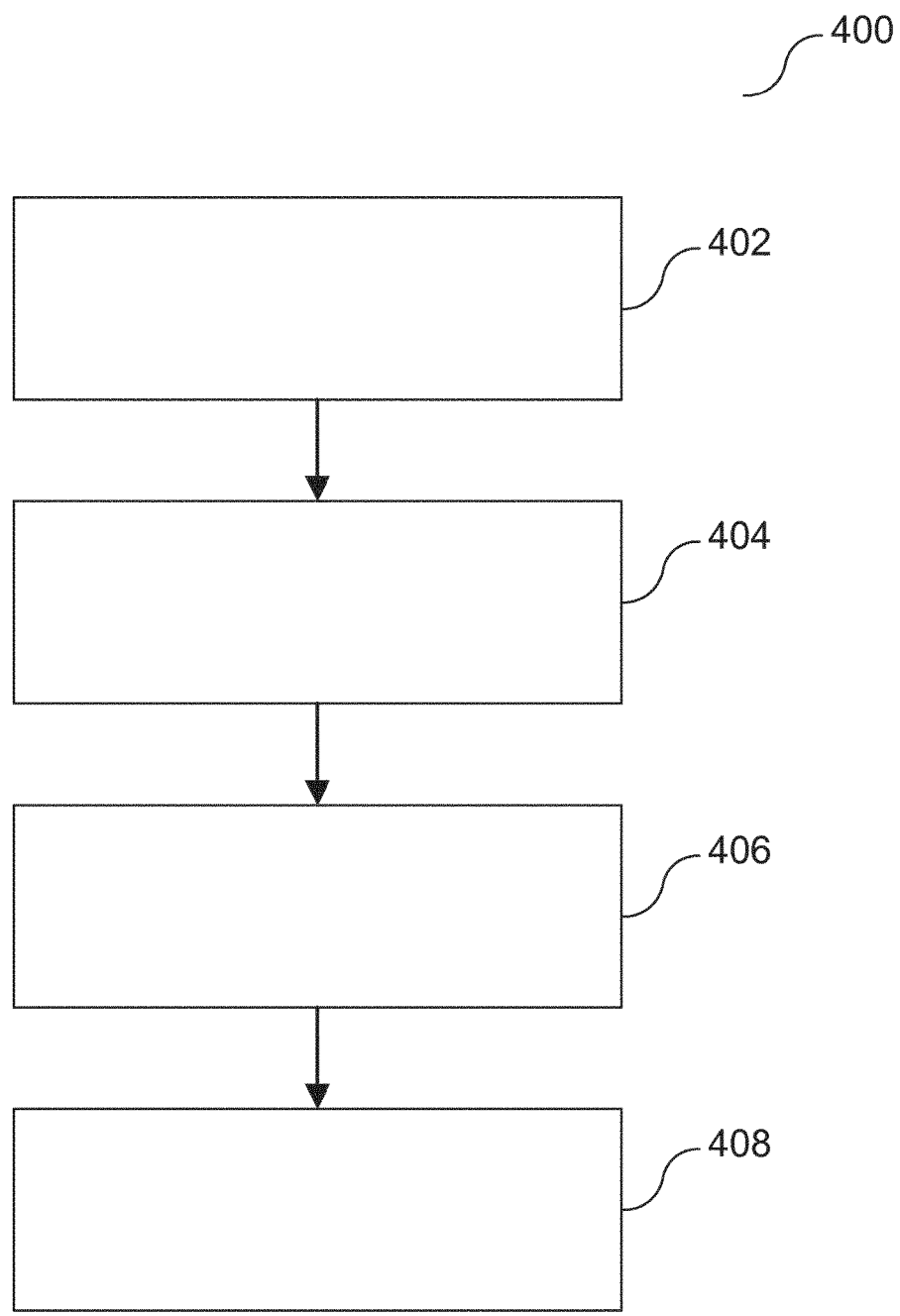
FIG. 4 shows a flow diagram of a method for producing an organic light-emitting component device in accordance with various exemplary embodiments.

FIG. 4 shows a flow diagram of a method for producing an organic light-emitting component device in accordance with various exemplary embodiments.

The method 400 comprises forming 402 a first organic light-emitting component and forming 404 at least one second organic light-emitting component.

The method furthermore comprises forming 406 a temperature detecting device. The temperature detecting device is configured for detecting at least one temperature.

The method furthermore comprises forming 408 a control unit. The control unit is coupled to the temperature detecting device. The control unit is configured to operate the first organic light-emitting component and the at least one second organic light-emitting component OLED2, OLED3.

The control unit is furthermore formed in such a way that a first operating parameter of the first organic light-emitting component and/or a second operating parameter of the at least one second organic light-emitting component are/is changed depending on the at least one detected temperature in such a way that the same or an approximately identical temperature is established at the first organic light-emitting component and the at least one second organic light-emitting component.

Figure 5:
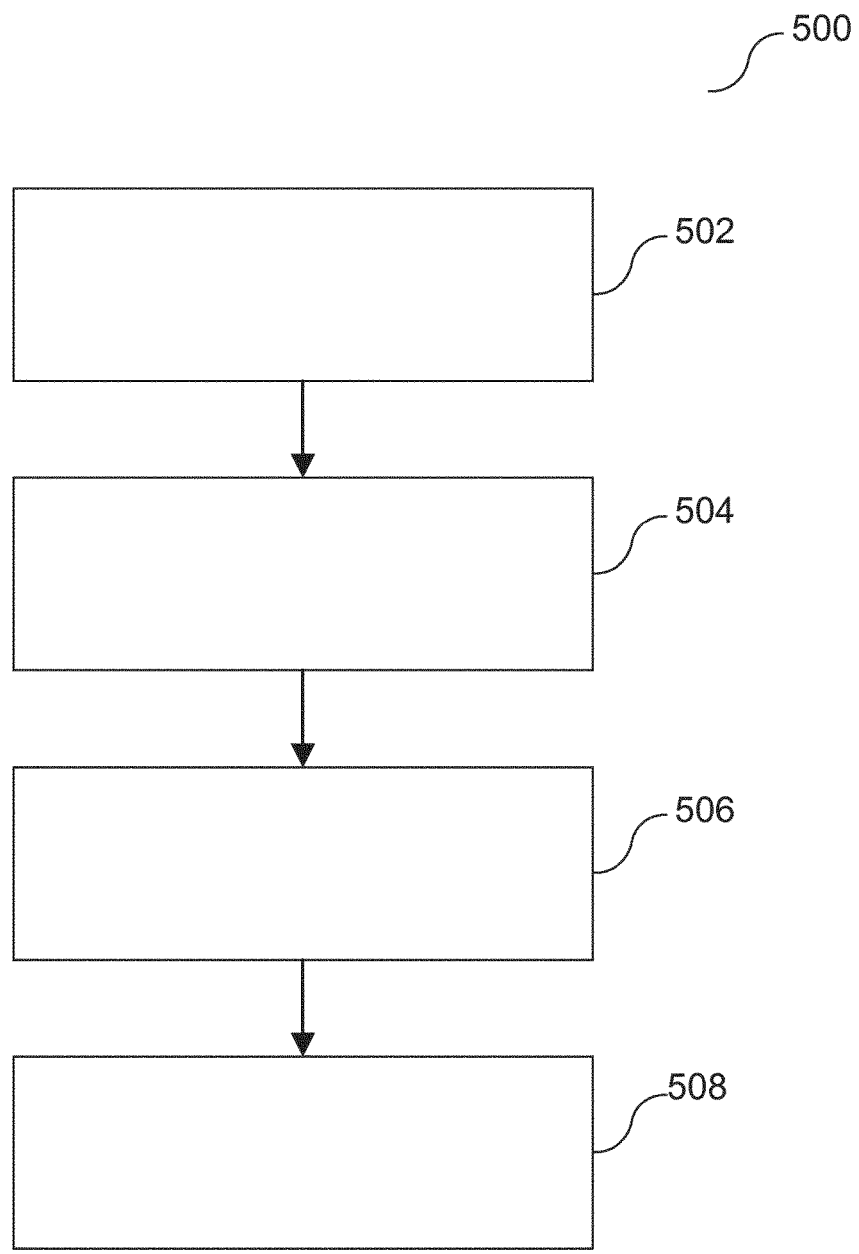
FIG. 5 shows a flow diagram of a method for operating an organic light-emitting component device in accordance with various exemplary embodiments.
Figure 6:
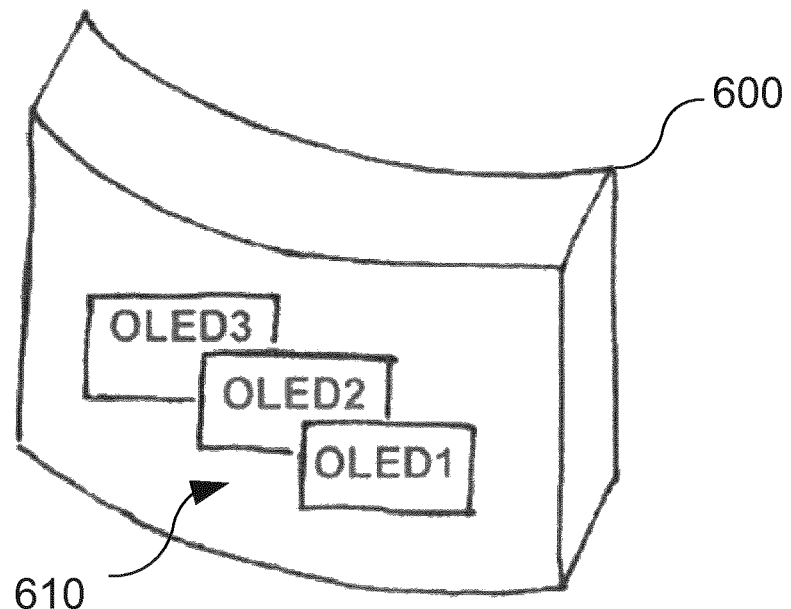
FIG. 6 shows a schematic illustration of a known automobile luminaire.

FIG. 5 shows a flow diagram of a method for operating an organic light-emitting component device in accordance with various exemplary embodiments.

The organic light-emitting component device comprises a first organic light-emitting component and at least one second organic light-emitting component.

The organic light-emitting component device furthermore comprises a temperature detecting device configured for detecting at least one temperature.

The organic light-emitting component device furthermore comprises a control unit coupled to the temperature detecting device and configured to operate the first organic light-emitting component and the at least one second organic light-emitting component. The control unit is formed in such a way that a first operating parameter of the first organic light-emitting component and/or a second operating parameter of the at least one second organic light-emitting component are/is changed depending on the at least one detected temperature in such a way that the same or an approximately identical temperature is established at the first organic light-emitting component and the at least one second organic light-emitting component.

The method 500 for operating comprises detecting 502 at least one temperature, determining 504 predefined at least first and second operating parameters, driving 506 the first organic light-emitting component with the first operating parameter, and driving 508 the second organic light-emitting component with the second operating parameter.

In various developments, the first operating parameter and/or the second operating parameter are/is changed in such a way that the intensity of the light which is emitted jointly by the first organic light-emitting component and the second organic light-emitting component after the change of the first operating parameter and/or of the second operating parameter is equal or substantially equal to the intensity of the light which is emitted jointly by the first organic light-emitting component and the second organic light-emitting component before the change. The intensity of the jointly emitted light can be lower than before the change of the first and/or second operating parameter. In various exemplary embodiments, the intensity of the jointly emitted light is however greater than a predefined value, i.e. exceeds the predefined value. The predefined value can be for example greater than or equal to a minimum intensity that is predefined in a standard.

In various developments, the temperature detecting device furthermore comprises a first temperature detecting device and at least one second temperature detecting device. The first temperature detecting device is designed for detecting a first temperature of the first organic light-emitting component. The second temperature detecting device is designed for detecting a second temperature of the second organic light-emitting component. The control unit is configured to change the first operating parameter and/or the second operating parameter depending on the difference between the first temperature and the second temperature. In this case, the method 500 can furthermore comprise detecting the first temperature and detecting the second temperature and determining the difference between the first temperature and second temperature. The first operating parameter and/or the second operating parameter are/is changed such that the first temperature and the second temperature are matched to one another.

In various developments, the temperature detecting device furthermore comprises a temperature detecting device for detecting an ambient temperature, wherein the ambient temperature is the at least one detected temperature. The first control unit is furthermore configured to compare the detected ambient temperature with predefined temperature values and to change the first operating parameter and the second operating parameter in accordance with predefined operating parameters dependent on the predefined temperature values. In this case, the method 500 comprises detecting the ambient temperature, determining a predefined temperature which is the most similar to the detected temperature, and reading out the predefined and stored first and second operating parameters dependent on the determined predefined temperature.

A first exemplary embodiment, described in association with FIGS. 1 to 5, is an organic light-emitting component device (100, 200) comprising: a first organic light-emitting component (OLED1), and at least one second organic light-emitting component (OLED2, OLED3), a temperature detecting device configured for detecting at least one temperature ($T_{OLED1-3}$, $T_A$), and a control unit (130, 230) coupled to the temperature detecting device and configured to operate the first organic light-emitting component (OLED1) and the at least one second organic light-emitting component (OLED2, OLED3), wherein the control unit (130, 230) is formed in such a way that, depending on the at least one detected temperature ($T_{OLED1-3}$, $T_A$), a first operating parameter ($j_{OLED1}$) of the first organic light-emitting component (OLED1) and/or a second operating parameter ($j_{OLED2}$, $j_{OLED3}$) of the at least one second organic light-emitting component (OLED2, OLED3) are/is changed.

In a second exemplary embodiment, the first exemplary embodiment optionally comprises the fact that the first operating parameter ($j_{OLED1}$) and/or the second operating parameter ($j_{OLED2}$, $j_{OLED3}$) are/is changed in such a way that the same or an approximately identical temperature is established at the first organic light-emitting component (OLED1) and the at least one second organic light-emitting component (OLED2, OLED3).

In a third exemplary embodiment, the first or second exemplary embodiment optionally comprises the fact that the organic light-emitting component device (100, 200) is formed as an illuminant.

In a fourth exemplary embodiment, one of the first to third exemplary embodiments optionally furthermore comprises a first light-emitting assembly configured for emitting a light of a first color valence, and a second light-emitting assembly configured for emitting a light of a second color valence, wherein the first color valence is different than the second color valence, and wherein the first light-emitting assembly comprises the first organic light-emitting component (OLED1) and the at least one second organic light-emitting component (OLED2, OLED3).

In a fifth exemplary embodiment, one of the first to fourth exemplary embodiments optionally comprises the fact that the temperature detecting device comprises a first temperature detecting device and at least one second temperature detecting device, wherein the first temperature detecting device is designed for detecting a first temperature ($T_{OLED1}$) of the first organic light-emitting component (OLED1), and the second temperature detecting device is designed for detecting a second temperature ($T_{OLED2}$, $T_{OLED3}$) of the second organic light-emitting component (OLED2, OLED3), and wherein the control unit (130, 230) is configured to change the first operating parameter ($j_{OLED1}$) and/or the second operating parameter ($j_{OLED2}$, $j_{OLED3}$) depending on the difference between the first temperature ($T_{OLED1}$) and the second temperature ($T_{OLED2}$, $T_{OLED3}$).

In a sixth exemplary embodiment, one of the first to fifth exemplary embodiments optionally comprises the fact that the temperature detecting device comprises a temperature detecting device (260) for detecting an ambient temperature ($T_A$) and the at least one detected temperature is or comprises the ambient temperature ($T_A$).

In a seventh exemplary embodiment, one of the first to sixth exemplary embodiments optionally furthermore comprises a covering body, wherein the organic light-emitting components with the covering body shape or surround a 0, and the ambient temperature ($T_A$) comprises a temperature in the cavity.

In an eighth exemplary embodiment, the sixth or seventh exemplary embodiment optionally comprises the fact that the control unit (130, 230) is configured to compare the detected ambient temperature ($T_A$) with predefined temperature values (232) and to change the first operating parameter ($j_{OLED1}$) and the second operating parameter ($j_{OLED2}$, $j_{OLED3}$) in accordance with predefined operating parameters (234) dependent on the predefined temperature values (232).

In a ninth exemplary embodiment, one of the first to eighth exemplary embodiments optionally comprises the fact that the control unit (130, 230) comprises a stored first threshold value and is configured to compare the at least one detected temperature with the first threshold value, wherein a change of at least the first operating parameter ($j_{OLED1}$) and/or of the second operating parameter ($j_{OLED2}$, $j_{OLED3}$) is effected only proceeding from a detected temperature greater than or equal to the first threshold value.

In a tenth exemplary embodiment, one of the first to ninth exemplary embodiments optionally comprises the fact that the control unit (130, 230) comprises a stored second threshold value and is configured to compare the at least one detected temperature with the second threshold value, and a change of at least the first operating parameter ($j_{OLED1}$) and/or of the second operating parameter ($j_{OLED2}$, $j_{OLED3}$) is exclusively effected if the detected temperature is less than or equal to the second threshold value.

In an eleventh exemplary embodiment, one of the first to tenth exemplary embodiments optionally comprises the fact that the control unit (130, 230) comprises a stored third threshold value and is configured to compare the at least one detected temperature with the third threshold value, wherein the control unit (130, 230), if the detected temperature reaches, exceeds or falls below the third threshold value, continues to operate the first organic light-emitting component (OLED1) and de-energizes at least the second organic light-emitting component (OLED2, OLED3).

In a 12th exemplary embodiment, one of the first to eleventh exemplary embodiments optionally comprises the fact that at least the first organic light-emitting component (OLED1) comprises an organic light-emitting component and at least one further organic light-emitting component.

In a 13th exemplary embodiment, one of the first to 12th exemplary embodiments optionally comprises the fact that at least the first organic light-emitting component (OLED1) is formed as a temperature detecting device, is formed such that it is operable at least partly as a temperature detecting device, or comprises a temperature detecting device.

A 14th exemplary embodiment, described in association with FIGS. 1 to 5, is a method (400) for producing an organic light-emitting component device (100, 200), the method comprising: forming (402) a first organic light-emitting component (OLED1), and forming (404) at least one second organic light-emitting component, forming (406) a temperature detecting device configured for detecting at least one temperature ($T_{OLED1-3}$, $T_A$), and forming (408) a control unit (130, 230) coupled to the temperature detecting device and configured to operate the first organic light-emitting component (OLED1) and the at least one second organic light-emitting component (OLED2, OLED3), wherein the control unit (130, 230) is formed in such a way that a first operating parameter of the first organic light-emitting component (OLED1) and/or a second operating parameter of the at least one second organic light-emitting component (OLED2, OLED3) are/is changed in this way depending on the at least one detected temperature.

In a 15th exemplary embodiment, the 14th exemplary embodiment optionally comprises the fact that the first operating parameter ($j_{OLED1}$) and/or the second operating parameter ($j_{OLED2}$, $j_{OLED3}$) are/is changed in such a way that the same or an approximately identical temperature is established at the first organic light-emitting component (OLED1) and the at least one second organic light-emitting component (OLED2, OLED3).

A 16th exemplary embodiment, described in association with FIGS. 1 to 5, is a method (500) for operating an organic light-emitting component device (100, 200), the component device comprising: a first organic light-emitting component (OLED1), and at least one second organic light-emitting component (OLED2, OLED3), a temperature detecting device configured for detecting at least one temperature ($T_{OLED1-3}$, $T_A$), and a control unit (130, 230) coupled to the temperature detecting device and configured to operate the first organic light-emitting component (OLED1) and the at least one second organic light-emitting component (OLED2, OLED3), wherein the control unit (130, 230) is formed in such a way that a first operating parameter of the first organic light-emitting component (OLED1) and/or a second operating parameter of the at least one second organic light-emitting component (OLED2, OLED3) are/is changed in this way depending on the at least one detected temperature, the method (500) comprising: detecting (502) at least one temperature, determining (504) predefined at least first and second operating parameters, and driving (506) the first organic light-emitting component with the first operating parameter, and driving (508) the second organic light-emitting component with the second operating parameter.

In a 17th exemplary embodiment, the 16th exemplary embodiment optionally comprises the fact that the first operating parameter ($j_{OLED1}$) and/or the second operating parameter ($j_{OLED2}$, $j_{OLED3}$) are/is changed in such a way that the same or an approximately identical temperature is established at the first organic light-emitting component (OLED1) and the at least one second organic light-emitting component (OLED2, OLED3).

In an 18th exemplary embodiment, the 16th or 17th exemplary embodiment optionally comprises the fact that the first operating parameter ($j_{OLED1}$) and/or the second operating parameter ($j_{OLED2}$, $j_{OLED3}$) are/is changed in such a way that the intensity of the light which is emitted jointly by the first organic light-emitting component (OLED1) and the second organic light-emitting component (OLED2, OLED3) after the change of the first operating parameter ($j_{OLED1}$) and/or of the second operating parameter ($j_{OLED2}$, $j_{OLED3}$) is equal or substantially equal to the intensity of the light which is emitted jointly by the first organic light-emitting component (OLED1) and the second organic light-emitting component (OLED2, OLED3) prior to the change.

In a 19th exemplary embodiment, the 16th or 17th exemplary embodiment optionally comprises the fact that the first operating parameter ($j_{OLED1}$) and/or the second operating parameter ($j_{OLED2}$, $j_{OLED3}$) are/is changed in such a way that the intensity of the light which is emitted jointly by the first organic light-emitting component (OLED1) and the second organic light-emitting component (OLED2, OLED3) after the change of the first operating parameter ($j_{OLED1}$) and/or of the second operating parameter ($j_{OLED2}$, $j_{OLED3}$) is less than the intensity of the light which is emitted jointly by the first organic light-emitting component (OLED1) and the second organic light-emitting component (OLED2, OLED3) prior to the change, but is greater than a predefined value.

The invention is not restricted to the exemplary embodiments specified. By way of example, the organic light-emitting luminaire can comprise two or more organic light-emitting assemblies described above. A portion of the organic light-emitting components of the organic light-emitting assemblies can jointly share a temperature detecting device. Furthermore, the organic light-emitting components can have a mutually different size, luminous area and/or shape. This can result in a mutually different installation situation and heat dissipation, for example. Furthermore, the driving of the organic light-emitting components, for example with regard to the current density, can be effected in a pulsed manner, for example be pulse-, frequency- or amplitude-modulated. Furthermore, exemplary embodiments of the organic light-emitting component can be applied in an analogous manner and insofar as is applicable to the method for producing and operating the organic light-emitting component, and vice-versa.

While the invention has been particularly shown and described with reference to specific embodiments, it should be understood by those skilled in the art that various changed in form and detail may be made therein without departing from the spirit and scope of the invention as defined by the appended claims. The scope of the invention is thus indicated by the appended claims and all changes which come within the meaning and range of equivalency of the claims are therefore intended to be embraced.

LIST OF REFERENCE SIGNS 100, 200 Organic light-emitting component device
110 Organic light-emitting luminaire
120 Organic light-emitting components
130, 230 Control unit
140 Reading out a temperature of an organic light-emitting component
150 Reading out an electric current of an organic light-emitting component
232 Predefined ambient temperature
234 Predefined current density
240 Detected ambient temperature
260 External temperature detecting device
1 Organic light-emitting component
12 Carrier
14 Electrode layer
16, 18 Contact section
20, 23 Electrode
21 Insulation barrier
22 Organic functional layer structure
24 Encapsulation layer
32, 34 Contact region
36 Adhesion-medium layer
38 Covering body
400, 500 Method flow diagram
402, 404, 406, 408, 502, 504, 506, 508 Method steps
600 Rear luminaire
610 Organic light-emitting diode

The invention claimed is:

1. An organic light-emitting component device comprising:
   a first organic light-emitting component, and at least one second organic light-emitting component,
   a temperature detecting device configured for detecting at least one temperature, and
   a control unit coupled to the temperature detecting device and configured to operate the first organic light-emitting component and the at least one second organic light-emitting component,
   wherein the control unit is formed in such a way that, depending on the at least one detected temperature, a first operating parameter of the first organic light-emitting component or a second operating parameter of the at least one second organic light-emitting component is changed,
   wherein the temperature detecting device comprises a first temperature detecting device and at least one second temperature detecting device,
   wherein the first temperature detecting device is designed for detecting a first temperature of the first organic light-emitting component, and
   the second temperature detecting device is designed for detecting a second temperature of the second organic light-emitting component, and
   wherein the control unit is configured to change the first operating parameter or the second operating parameter depending on the difference between the first temperature and the second temperature,
   wherein the first operating parameter or the second operating parameter is changed in such a way that the same or an approximately identical temperature is established at the first organic light-emitting component and the at least one second organic light-emitting component.

2. The organic light-emitting component device as claimed in claim 1,
   wherein the organic light-emitting component device is formed as an illuminant.

3. The organic light-emitting component device as claimed in claim 1, further comprising:
   a first light-emitting assembly configured for emitting a light of a first color valence, and
   a second light-emitting assembly configured for emitting a light of a second color valence, wherein the first color valence is different than the second color valence, and
   wherein the first light-emitting assembly comprises the first organic light-emitting component and the at least one second organic light-emitting component.

4. The organic light-emitting component device as claimed in claim 1,
   wherein the temperature detecting device comprises a temperature detecting device for detecting an ambient temperature and at least one of the at least one detected temperature is the ambient temperature.

5. The organic light-emitting component device as claimed in claim 1, further comprising a covering body, wherein the first organic light-emitting component and the second organic light-emitting component with the covering body shape or surround a cavity, and an ambient temperature comprises a temperature in the cavity.

6. The organic light-emitting component device as claimed in claim 4,
   wherein the control unit is configured to compare the detected ambient temperature with predefined temperature values and to change the first operating parameter and the second operating parameter in accordance with predefined operating parameters dependent on the predefined temperature values.

7. The organic light-emitting component device as claimed in claim 1, wherein the control unit comprises a stored first threshold value and is configured to compare the at least one detected temperature with the first threshold value, wherein a change of at least the first operating parameter and/or of the second operating parameter is effected only proceeding from a detected temperature greater than or equal to the first threshold value.

8. The organic light-emitting component device as claimed in claim 1, wherein the control unit comprises a stored second threshold value and is configured to compare the at least one detected temperature with the second threshold value, and a change of at least the first operating parameter and/or of the second operating parameter is exclusively effected if the detected temperature is less than or equal to the second threshold value.

9. The organic light-emitting component device as claimed in claim 1, wherein the control unit comprises a stored third threshold value and is configured to compare the at least one detected temperature with the third threshold value, wherein the control unit, if the detected temperature reaches, exceeds or falls below the third threshold value, continues to operate the first organic light-emitting component and de-energizes at least the second organic light-emitting component.

10. The organic light-emitting component device as claimed in claim 1, wherein at least the first organic light-emitting component of the first organic light-emitting component and the second organic light-emitting component comprises an organic light-emitting component and at least one further organic light-emitting component.

11. The organic light-emitting component device as claimed in claim 1, wherein at least the first organic light-emitting component of the first organic light-emitting component and the second organic light-emitting component is formed as a temperature detecting device, and is formed such that it is operable at least partly as the temperature detecting device, or comprises the temperature detecting device.

12. A method for producing an organic light-emitting component device, the method comprising:

forming a first organic light-emitting component, and forming at least one second organic light-emitting component, forming a temperature detecting device comprising a first temperature detecting device and at least one second temperature detecting device, wherein the first temperature detecting device is designed for detecting a first temperature of the first organic light-emitting component and the at least one second temperature detecting device is designed for detecting at least one second temperature of the at least second organic light-emitting component, and forming a control unit coupled to the temperature detecting device and configured to operate the first organic light-emitting component and the at least one second organic light-emitting component, wherein the control unit is configured to change the first operating parameter or the second operating parameter depending on the difference between the first temperature and the at least one second temperature, and wherein the first operating parameter or the second operating parameter is changed in such a way that the same or an approximately identical temperature is established at the first organic light-emitting component and the at least one second organic light-emitting component.

13. A method for operating an organic light-emitting component device, the component device comprising:

a first organic light-emitting component, and at least one second organic light-emitting component, a temperature detecting device, comprising a first temperature detecting device and at least one second temperature detecting device, wherein the first temperature detecting device is designed for detecting a first temperature of the first organic light-emitting component and the at least one second temperature detecting device is designed for detecting at least one second of the at least one second organic light-emitting component, and a control unit coupled to the temperature detecting device and configured to operate the first organic light-emitting component and the at least one second organic light-emitting component, wherein the control unit is configured to change the first operating parameter or the second operating parameter depending on the difference between the first temperature and the at least one second temperature, and wherein the first operating parameter or the second operating parameter is changed in such a way that the same or an approximately identical temperature is established at the first organic light-emitting component and the at least one second organic light-emitting component, the method comprising:

detecting the first temperature and the second operating parameters, determining predefined at least first and second operating parameters, and driving the first organic light-emitting component with the first operating parameter, or driving the second organic light-emitting component with the second operating parameter.

14. The method as claimed in claim 13, wherein the first operating parameter or the second operating parameter is changed in such a way that the same or an approximately identical temperature is established at the first organic light-emitting component and the at least one second organic light-emitting component.

15. The method as claimed in claim 13, wherein the first operating parameter or the second operating parameter is changed in such a way that the intensity of the light emitted jointly by the first organic light-emitting component and the at least one second organic light-emitting component after the change of the first operating parameter or of the second operating parameter is equal or substantially equal to the intensity of the light emitted jointly by the first organic light-emitting component and the second organic light-emitting component prior to the change.

16. The method as claimed in claim 13, wherein the first operating parameter or the second operating parameter is changed in such a way that the intensity of the light emitted jointly by the first organic light-emitting component and the second organic light-emitting component after the change of the first operating parameter or of the second operating parameter is less than the intensity of the light emitted jointly by the first organic light-emitting component and the second organic light-emitting component prior to the change, but is greater than a predefined value, but is greater than a predefined value.

* * * * *